(12) United States Patent
Koegel et al.

(10) Patent No.: US 6,595,796 B1
(45) Date of Patent: Jul. 22, 2003

(54) FLEXIBLE FILM CIRCUIT CONNECTOR

(75) Inventors: Keith Scott Koegel, Plainfield, PA (US); Earl Chester Myers, Jr., Harrisburg, PA (US)

(73) Assignee: The Whitaker Corporation, Wilmington, DE (US)

( * ) Notice: Subject to any disclaimer, the term of this patent is extended or adjusted under 35 U.S.C. 154(b) by 737 days.

(21) Appl. No.: 09/030,032

(22) Filed: Feb. 25, 1998

Related U.S. Application Data

(60) Provisional application No. 60/042,218, filed on Mar. 31, 1997.

(51) Int. Cl.$^7$ ................................................ H01R 12/24
(52) U.S. Cl. .................................... 439/495; 329/77
(58) Field of Search .......................... 439/67, 73, 72, 439/77, 329, 462, 492, 493, 494, 495, 499, 59–65

(56) References Cited

U.S. PATENT DOCUMENTS

| | | | |
|---|---|---|---|
| 3,737,833 A | * | 6/1973 | Jerominek ............... 339/17 F |
| 3,851,294 A | | 11/1974 | Palazzetti et al. |
| 4,017,138 A | | 4/1977 | Evans |
| 4,367,006 A | | 1/1983 | Rehbogen, Jr. et al. |
| 4,406,511 A | | 9/1983 | Hayes |
| 4,629,271 A | | 12/1986 | Awano |
| 4,639,063 A | | 1/1987 | Mueller |
| 4,713,020 A | | 12/1987 | Awano et al. |
| 4,718,859 A | | 1/1988 | Gardner |
| 4,770,645 A | * | 9/1988 | Antes ........................ 439/329 |
| 4,778,403 A | | 10/1988 | Ikesugi et al. |
| 5,051,366 A | | 9/1991 | Anderson et al. ............ 436/67 |
| 5,061,205 A | | 10/1991 | Toramoto |
| 5,074,806 A | | 12/1991 | Korsunsky et al. |
| 5,106,311 A | | 4/1992 | Yodogawa et al. |
| 5,194,017 A | | 3/1993 | Consoli |
| 5,306,162 A | | 4/1994 | Armendariz |
| 5,354,214 A | | 10/1994 | Aso et al. |
| 5,385,478 A | | 1/1995 | Niekawa ....................... 439/67 |
| 5,401,186 A | | 3/1995 | Nozaki et al. |
| 5,402,316 A | | 3/1995 | Volz et al. |
| 5,514,008 A | | 5/1996 | Kocher et al. |
| 5,690,510 A | | 11/1997 | Chishima ................... 439/496 |

FOREIGN PATENT DOCUMENTS

| | | | |
|---|---|---|---|
| EP | 0280449 | 2/1988 | ........... H01R/23/72 |
| GB | 2178252 A | 7/1986 | ............ H01R/4/52 |
| JP | 08022870 | 1/1996 | ........... H01R/23/66 |

OTHER PUBLICATIONS

International Search Report, PCT/US98/05824, Jun. 29, 1996.

All about J.S.T., vol. 4, Jul. 1988, catalog—no author, pp. 59 and 60.

* cited by examiner

*Primary Examiner*—Lincoln Donovan

(57) ABSTRACT

A backer plate (40) secured to leading end portion (20) of flexible film circuit (10), providing rigidity to facilitate manipulation of the circuit during mating with and unmating from a receptacle connector (26). Backer plate (40) may either be molded of insulative material or be conductive to serve as a ground connection. Backer plate (40) has side walls (48) beside the flex film that provide flanges (54) to precisely guide mating with connector (26) along slots (32), and may also provide detents (56) for retention in the connector. Backer plate (40) may also provide bosses (60) to stop forward movement at a precise location aligning the strip circuits with connector contacts (30). Flanges (54) offset from the central plane of the strip/backer plate assembly, line up with slots (32) offset from the central plane of cavity (24) in order to permit insertion only when the assembly is properly oriented, thus serving to polarize the assembly.

38 Claims, 7 Drawing Sheets

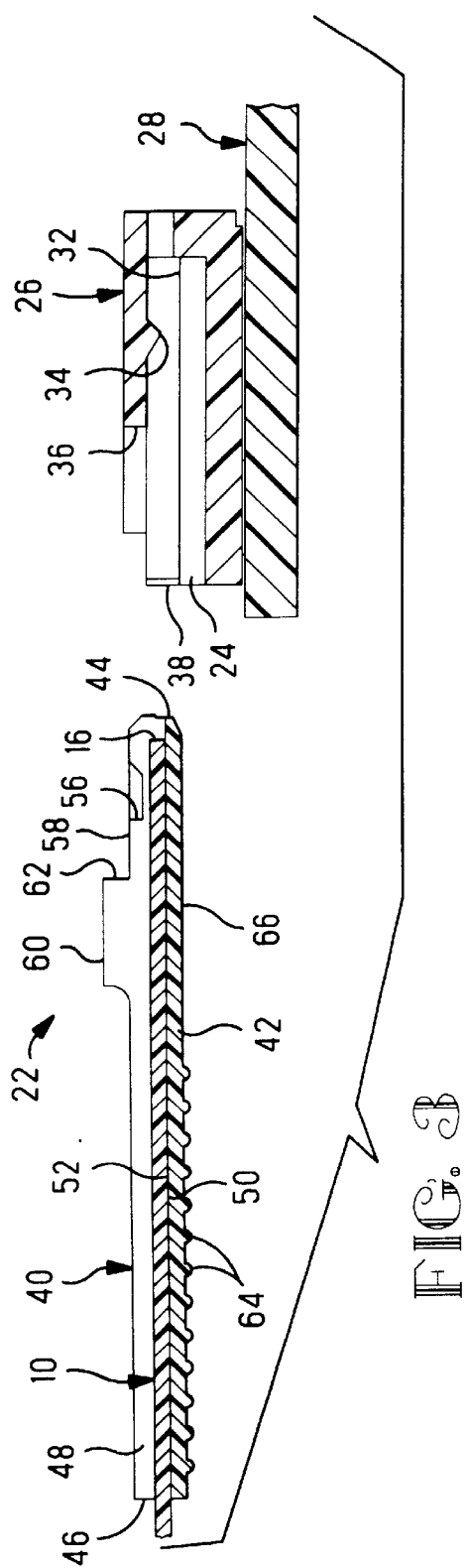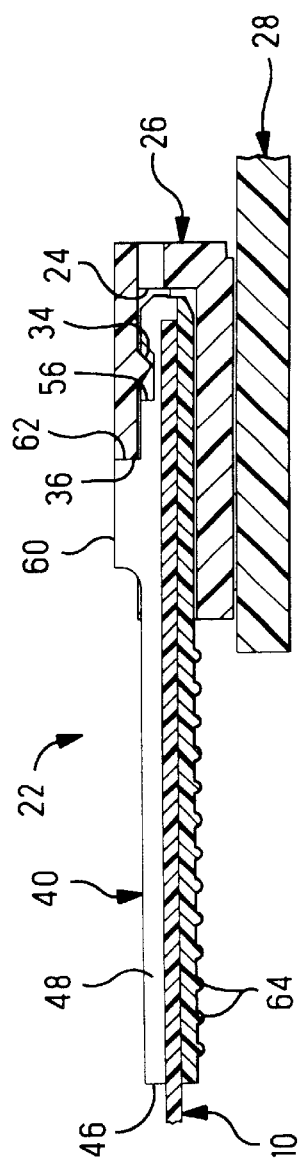

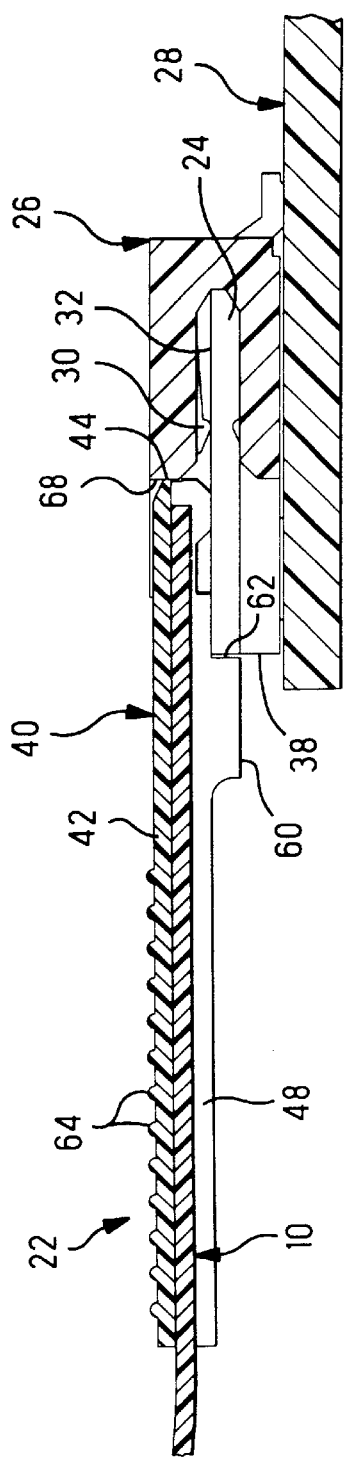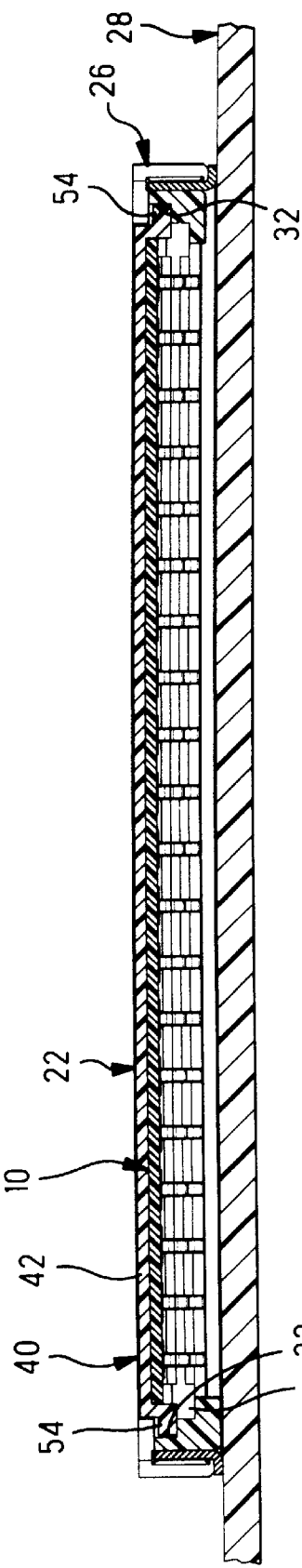

FLEXIBLE FILM CIRCUIT CONNECTOR

This application claims the benefit of U.S. Provisional Application No. 60/042,218, filed Mar. 31, 1997.

FIELD OF THE INVENTION

This relates to the field of electrical connectors and more particularly to connectors for interconnection of flexible film circuits.

BACKGROUND OF THE INVENTION

An electrical connector is known wherein a receptacle connector is mounted onto a circuit board at an edge thereof, and a leading edge of a flexible film circuit strip is insertable into the receptacle connector for contacts of the connector pressed against respective circuits of the strip to establish electrical connections therewith. A simple planar board of insulative material such as of "G10" material and as wide as the strip, is conventionally adhered to an insulated surface of the strip opposed to the exposed circuits to provide strength and rigidity to facilitate insertion and interconnection, and the flexible film circuit strip is held in the mated condition by the friction of the contacts against the film's circuits. One such receptacle connector is sold by AMP Incorporated, Harrisburg, Pa. under Part No. 353088-1.

It is desired to provide for protection against mating of the flexible film circuit strip with a receptacle connector in an inverted orientation. It is also desired to provide for assured resistance against inadvertent unmating, and also for control over the forward movement of the strip\backer board assembly upon full mating.

SUMMARY OF THE INVENTION

The present invention is a backer plate that is adhered to an insulated surface of the flexible film circuit strip. The backer plate provides a pair of low height side walls that therebetween define a nest for placement of the leading edge portion of the flexible film circuit strip precisely located with respect to a leading edge of the plate.

In one embodiment, the backer plate is molded of insulative plastic material and preferably includes features molded thereon for indication of full mating, for polarization and for maintaining the strip/backer plate assembly in a fully mated condition after insertion into the receptacle connector. The side walls may each define an upstanding boss spaced rearwardly from the plate leading edge, the bosses abutting forwardly facing surfaces of the receptacle connector positioned at both sides of the receiving cavity thereof below the median of the entrance, upon full mating. The leading edge of the backer plate will abut a forward wall of the receptacle housing prior to strip insertion, were the strip\backer plate assembly to be inverted, thus defining a polarization feature. The backer plate also preferably includes either detents or embossments that cooperate with embossments or detents of the receptacle connector (or the circuit board to which it is mounted) upon full mating to latch the strip\backer plate assembly in the mated condition.

In another embodiment, the backer plate is formed of metal to include the upstanding side walls to define the film-receiving nest, and may have outwardly extending flanges to cooperate with guide slots on the receptacle connector. Embossments formed along the film-remote surface of the body section cooperate with detents on the circuit board forwardly of the receptacle connector, to secure the strip/backer plate assembly in mated condition. The conductive backer plate may serve as a ground connection with a ground circuit of the circuit board through the embossments, where the board detents are connected to a ground circuit, and where the backer plate includes a ground post soldered to a ground circuit of the flexible film strip.

Embodiments of the present invention will now be described by way of example with reference to the accompanying drawings.

BRIEF DESCRIPTION OF THE DRAWINGS

FIGS. 3 and 4 are longitudinal section views of the strip assembly and the receptacle connector of FIG. 1 posed to be mated, and fully mated, respectively;

FIGS. 5 and 6 illustrate an inverted strip assembly prevented from becoming mated to the receptacle connector, in longitudinal section view and cross-section view, respectively;

DETAILED DESCRIPTION OF THE EMBODIMENTS

Figure 1:
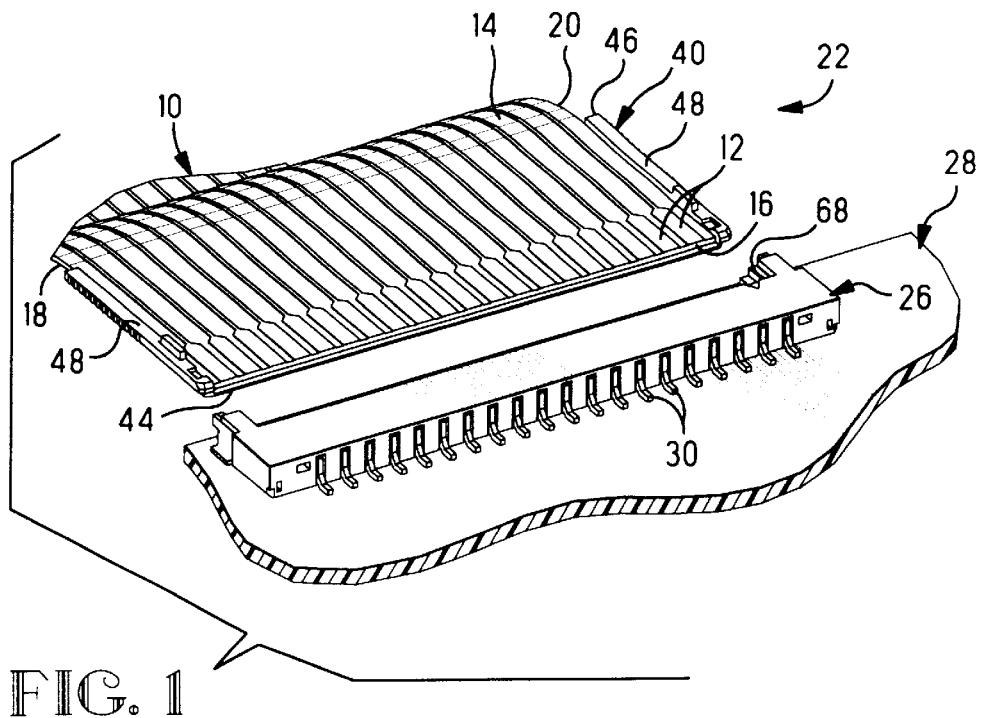
FIG. 1 is an isometric view of a receptacle connector mounted onto a circuit board positioned to be mated with a flexible film circuit strip having secured thereto the backer plate of the present invention.
Figure 2:
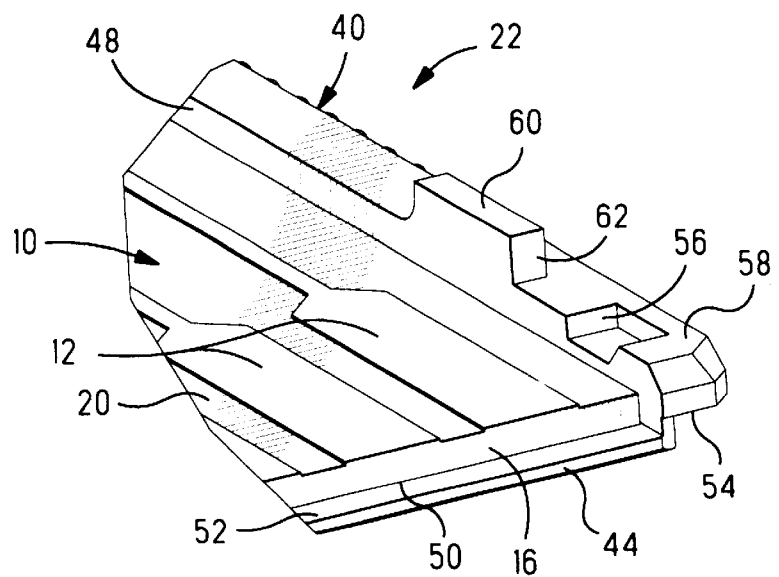
FIG. 2 is an enlarged isometric view of one end of the backer plate of FIG. 1.

Referring first to FIGS. 1 to 3, flexible film circuit strip 10 provides an array of circuits extending to pads 12 exposed along a surface 14 of an insulative film at a leading end 16. A film-adjacent surface of backer plate 40 of the present invention is secured to insulated surface 18 of strip 10, such as by double sided adhesive tape (see FIG. 7). Together, leading strip end portion 20 and backer plate 40 define a connector assembly 22 that is insertable into a strip-receiving cavity 24 of receptacle connector 26 that is shown mounted to circuit board 28 and electrically connected to circuits thereof by contacts 30 that also become electrically connected to circuits of flexible film circuit strip 10 upon mating, thus interconnecting the circuit board to the strip. The backer plate of the present invention is complementary to a commercially available receptacle connector, such as the aforementioned product of AMP Incorporated, and requires no changes therein, and furthermore requires no processing of the flexible film circuit strip to be used therewith.

Planar body section 42 of backer plate 40 extends from leading edge 44 to rear edge 46, and opposed side walls 48 coextend orthogonally therefrom to define therebetween a strip-receiving nest 50 having a film-adjacent surface 52 adhered to insulated surface 18 of strip 10. With reference to FIG. 2, each side wall 48 includes an outwardly extending flange 54 that will enter a corresponding slot 32 at a side wall of plug-receiving cavity 24 of receptacle connector 26, and will serve to guide and precisely position assembly 22 to align circuit pads 12 with the contacts of the receptacle connector for appropriate electrical engagement.

Each side wall 48 also is seen to include a detent 56 defined in upper surface 58 proximate leading edge 44, and just rearwardly thereof, a boss 60 having a forward face 62. Upon full mating with receptacle connector 26 as seen in FIGS. 3 and 4, an embossment 34 of connector 26 within slot 32 seats in detent 56 of each side wall 48 serving to retain assembly 2 in mated condition with connector 26. Forward face 62 of boss 60 abuts recessed surface 36 of connector 26 above slots 32 to stop further forward movement when assembly 22 has been sufficiently inserted for mating of contacts 30 and circuits 12.

Also seen in FIGS. 3 and 4 is a pattern of ridges 64 traversing outwardly facing or film-remote surface 66 of body section 40, that facilitate manual gripping of assembly 22 for manipulation thereof. Backer plate 40 may be molded of plastic material, such as, for example, liquid crystal polymer resin. Preferably, chamfers are provided along corners and corner edges at leading edge 44 to facilitate insertion of flanges 54 into slots 32 and leading edge 44 into plug-receiving cavity 24.

As shown in FIGS. 5 and 6, assembly 22 is prevented from mating with receptacle connector 26 when improperly in an inverted orientation. Flanges 54 are offset upwardly from the central plane of the strip/backer plate assembly, and guide slots 24 are also correspondingly offset upwardly from the central plane of the receiving cavity 24. Since flanges 54 must enter slots 32 in order for assembly 22 to enter cavity 24, leading edge 44 of backer plate 40 will abut surface 68 of connector 26 adjacent the receiving cavity and thereabove. Additionally, bosses 60 may serve as a polarization feature by abutting surfaces 38 of connector 26 adjacent cavity 24 below slots 32; were the flanges and guide slots not offset, the bosses would provide an alternative polarization system.

Figure 7:
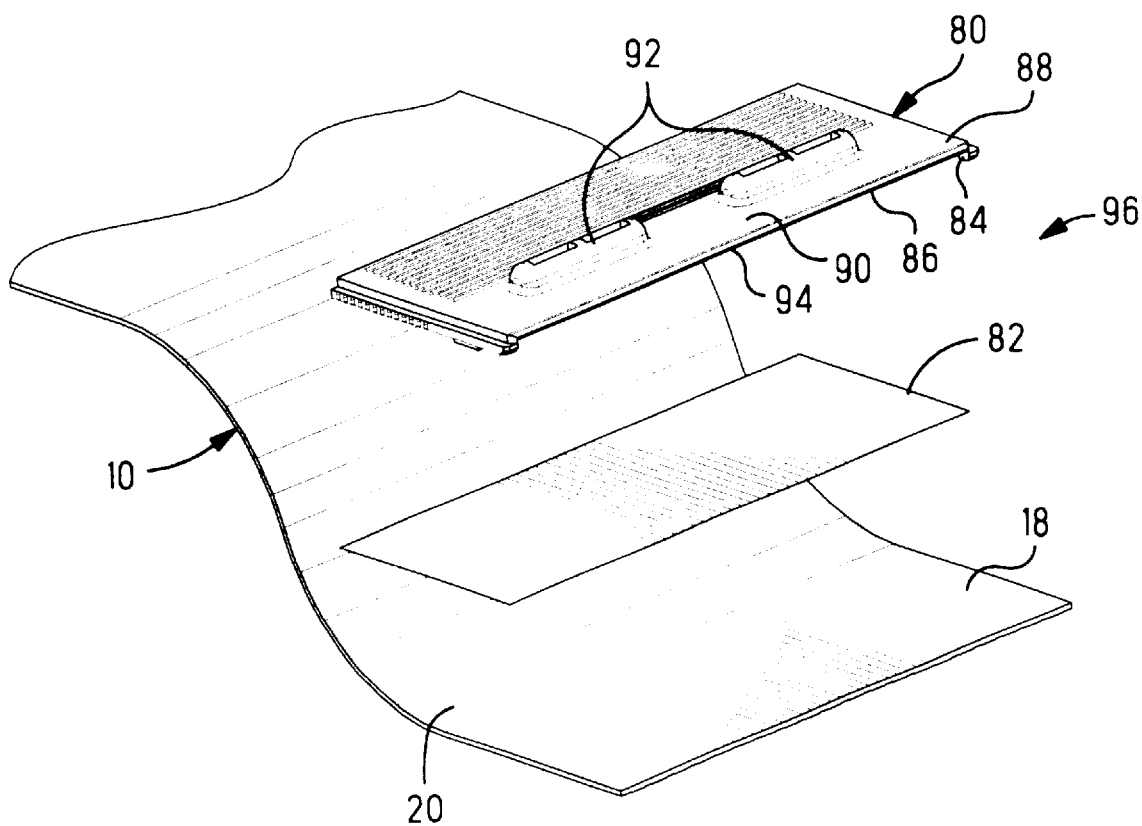
FIGS. 7 to 9 illustrate a second embodiment of backer plate, with the backer plate exploded from the strip in isometric view inverted, the strip assembly poised to be mated with the receptacle connector, and in cross-section in the mated condition, respectively.
Figure 8:
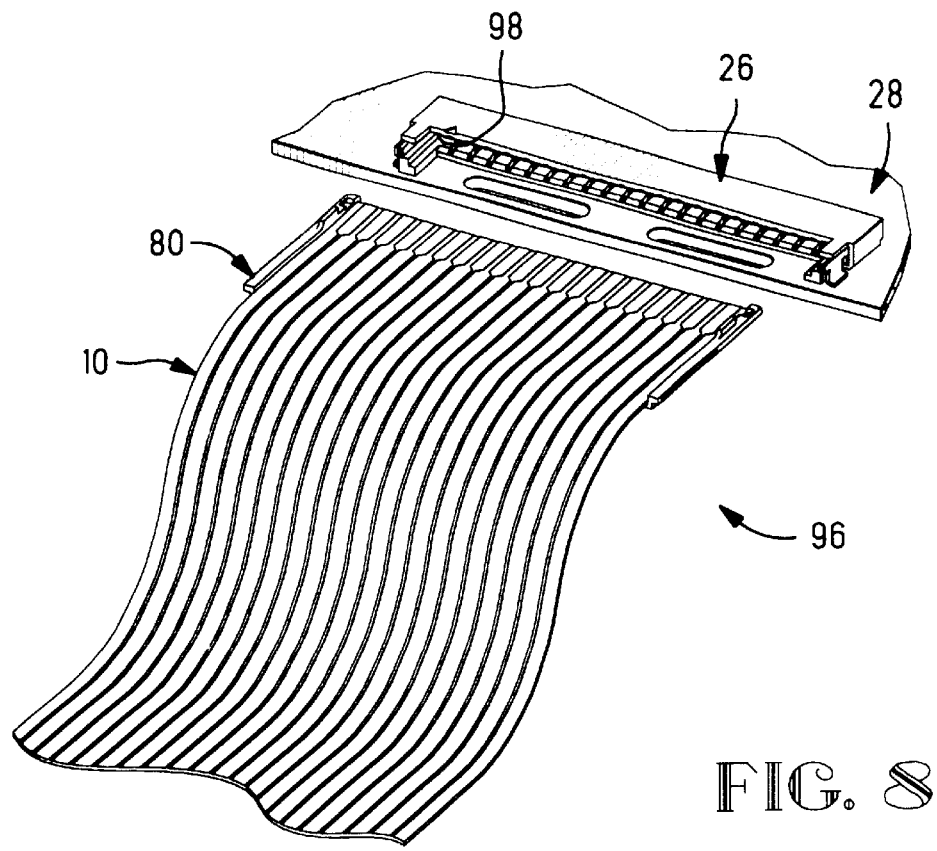
Figure 9:
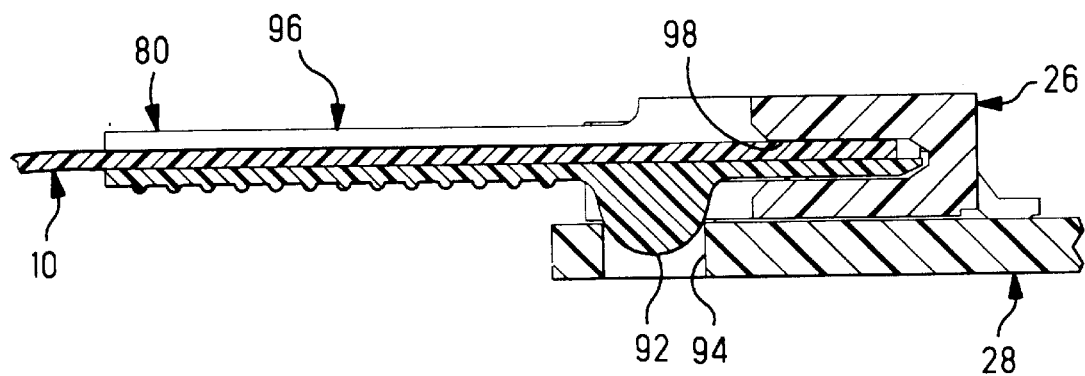

A second embodiment of backer plate 80 is shown in FIGS. 7 to 9. FIG. 7 illustrates backer plate 80 being secured to insulated surface 18 of flexible film circuit strip 10 by using double-sided adhesive tape 82 placed into nest 84, that will secure leading end strip portion 20 therein to surface 86. Outwardly facing surface 88 of body section 90 of backer plate 80 is shown to include a pair of rounded retention embossments 92 proximate leading edge 94. As seen in FIGS. 8 and 9, retention embossments 92 will seat in corresponding detents 94 of circuit board 28 just forwardly of receptacle connector 26, when assembly 96 is fully inserted into plug-receiving cavity 98. Retention embossments 92 may be used to enhance the retention of assembly 96 in connector 26 that is otherwise attained by detents 56 and connector embossments 34 as seen in FIGS. 2 to 4.

Figure 10:
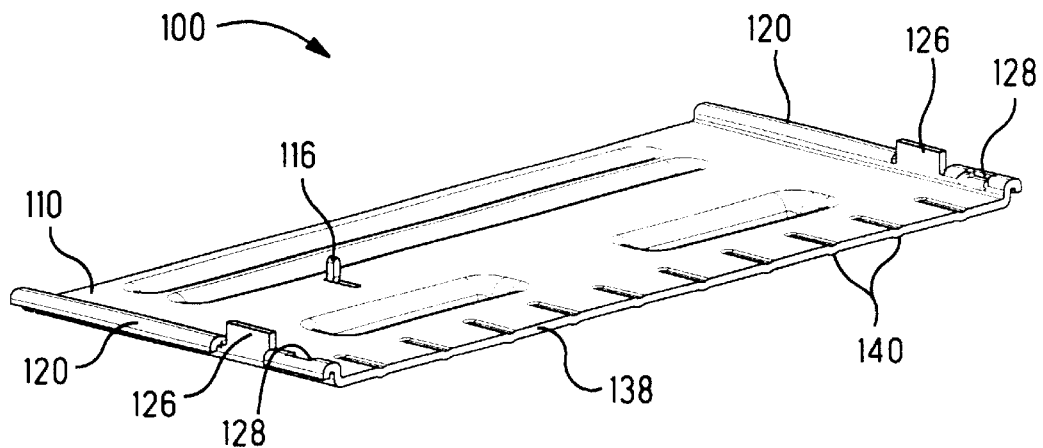
FIGS. 10 to 12 illustrate a third embodiment of backer plate, formed of metal, with FIGS. 10 and 11 being isometric and inverted isometric views of the backer plate, and FIG. 12 being a part cross-section of the strip/backer plate assembly mated with a receptacle connector.
Figure 11:
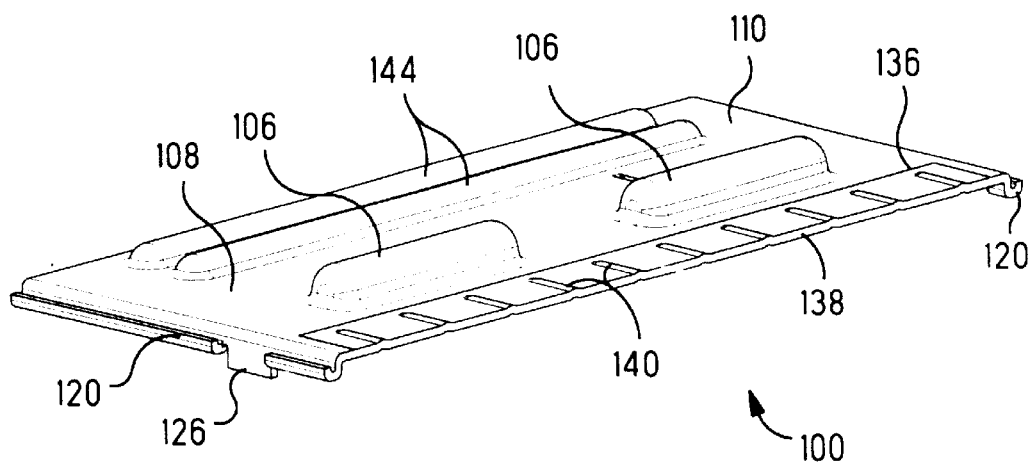
Figure 12:
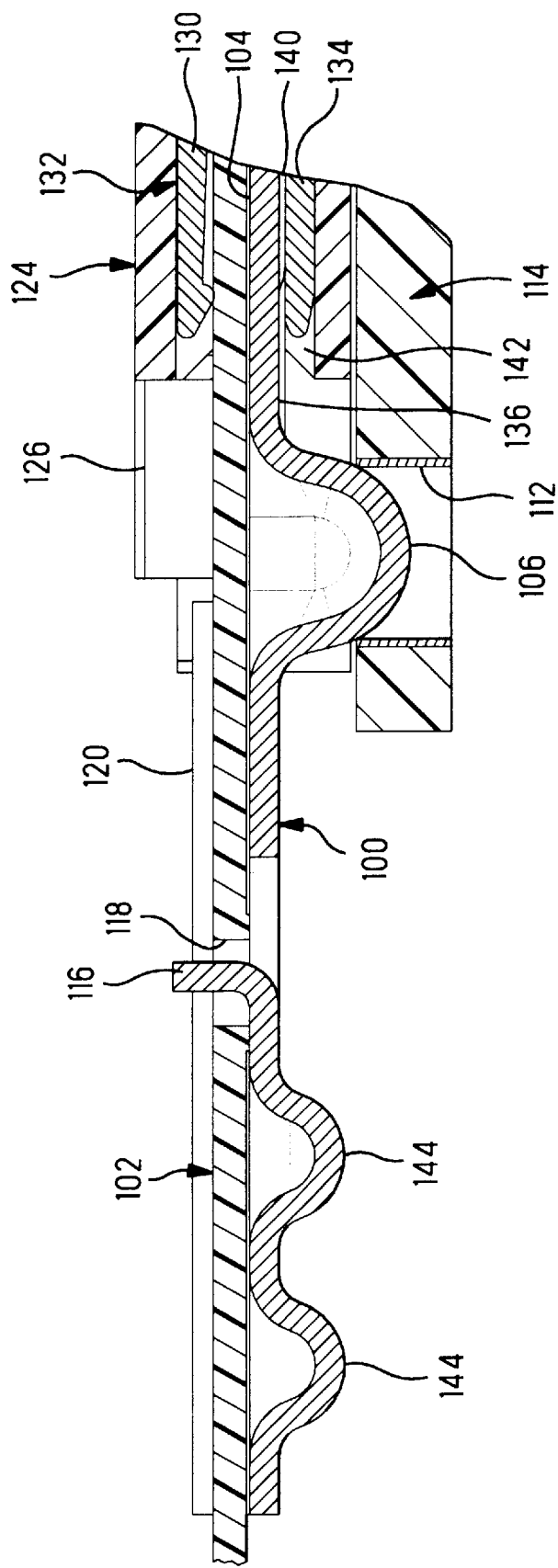

The backer plate may also be conductive, a third embodiment being shown in FIGS. 10 to 12. Backer plate 100 is formed of metal and may be cast or may be stamped and formed as shown. Backer plate 100 is isolated from signal circuits of the flexible strip 102 such as by use of nonconductive adhesive or double-sided tape 104. Embossments 106 protrude from film-remote surface 108 of body section 110 and cooperate with detents 112 of a circuit board 114, similarly to the arrangement shown in FIG. 9. Detents 112 are shown as being plated by conductive material joined to a ground circuit of the board, so conductive backer plate 100 serves as a ground, having a ground post 116 extending through a hole in the tape and a hole 118 in strip 102 to be soldered to a ground conductor of the strip. Side walls 120 preferably include outwardly extending flanges 122 to cooperate with guide slots of the receptacle connector 124 and may serve as a polarization feature as with the embodiments of FIGS. 1 to 9. An upstanding boss 126 serves as a positive stop indicator of full mating when it abuts a surface of the connector. Also, detents 128 forwardly of bosses 126 cooperate with embossments (not shown) of receptacle connector 124 in guide slots thereof, to maintain the strip/backer plate assembly in mated condition.

In FIG. 12, it may be seen that while an upper beam 130 of contact 132 in connector 124 is in engagement with a conductor of the flexible film strip 102 along an upper surface, a lower beam 134 is in engagement with the lower surface of the strip/backer plate assembly. Backer plate 100 is isolated from electrical engagement with lower contact beam 134 by a layer 136 of insulative material such as KAPTON polyimide tape (product of E. I. DuPont de Nemours & Co., Wilmington Del.), or a layer of a nonconductive spray, adhered on the film-remote surface 108 adjacent the front end 138 of body section 110. Further, it is preferred to provide an array of bumps 140 extending outwardly from film-remote surface 108 of body section 110 adjacent front end 138. Bumps 140 (covered with the insulative layer 136) are adapted to engage the top surfaces of ridges 142 of the housing of connector 124 provided between lower beams 134 of contacts 132, minimizing wear and tear on insulative layer 136 by frictional engagement by lower beams 134 during insertion and removal of the strip/backer plate assembly with respect to connector 124. Transverse ridges 144 are shown near the rearward end of body section 110 to facilitate manual gripping.

Other variations and modifications may occur that are within the spirit of the invention and the scope of the claims.

What is claimed is:

1. A backer plate for a flexible film circuit strip, comprising:

a member having a body section with a film non-adjacent surface and with a film-adjacent surface, said body section extending forwardly to a leading edge; and said member including side walls extending vertically from said film-adjacent surface along side edges thereof to define a film-receiving nest, whereby an end portion of said flexible film circuit strip is receivable into said film-receiving nest to be adhered to said film-adjacent surface to define an assembly insertable into a receiving cavity of a receptacle connector.

2. A backer plate as set forth in claim 1 wherein at least one said side wall includes an upstanding boss spaced rearwardly from said leading edge to abut a surface of the receptacle connector adjacent an associated side of a receiving cavity thereof to define a fully inserted condition when the strip with an insulative member thereon is inserted into the receiving cavity.

3. A backer plate as set forth in claim 1 wherein said film-non-adjacent surface of said body section includes ridges defined thereon to facilitate manual gripping for manipulation thereof.

4. A backer plate as set forth in claim 1 wherein said leading edge and corners of said member are chamfered to facilitate entry into said receiving cavity.

5. A backer plate as set forth in claim 1 wherein said member is molded of insulative material.

6. A backer plate as set forth in claim 1 wherein each said side wall includes an outwardly extending flange therealong.

7. A backer plate as set forth in claim 6 wherein said flanges are offset vertically from said body section to be received into correspondingly positioned guide slots of the receptacle connector for polarization.

8. A backer plate as set forth in claim 1 wherein said member proximate said leading edge includes at least one retention section cooperable with a retention section associated with a receptacle connector to retain said strip in said receiving cavity upon full insertion.

9. A backer plate as set forth in claim 8 wherein said retention section is a detent, cooperable with an embossment of said receptacle connector.

10. A backer plate as set forth in claim 9 wherein said side walls define respective said detents.

11. A backer plate as set forth in claim 8 wherein each said retention section is an embossment, cooperable with a detent associated with said receptacle connector.

12. A backer plate as set forth in claim 11 wherein two said embossments are elongate and transverse and protrude from said film-non-adjacent surface of said body section spaced rearwardly from said leading edge thereof.

13. A backer plate as set forth in claim 1 wherein said member is conductive.

14. A backer plate as set forth in claim 13 wherein said conductive backer plate is stamped and formed of metal.

15. A backer plate as set forth in claim 13 wherein said conductive backer plate includes a ground post electrically connected to a ground circuit of said flexible film strip, and includes an embossment seatable upon full insertion of said strip/backer plate assembly into said receiving cavity into a detent of a circuit board to which the receptacle connector is mounted, where the detent is conductively plated and connected to a ground circuit of the circuit board.

16. A backer plate as set forth in claim 13 wherein said member includes a layer of insulative material adjacent a front end of said body section, adhered to said film-non-adjacent surface thereof for isolation of said conductive backer plate from adjacent portions of contacts of the receptacle connector.

17. A backer plate for a flexible film circuit strip, comprising:
   a member having a body section with a film-non-adjacent surface and with a film-adjacent surface, said body section extending forwardly to a leading edge; and
   said member including side walls extending vertically from said film-adjacent surface along side edges thereof to define a film-receiving nest,
   whereby an end portion of said flexible film circuit strip is receivable into said film-receiving nest to be adhered to said film-adjacent surface to define an assembly insertable into a receiving cavity of a receptacle connector,
   wherein said member is conductive, and
   further wherein said member includes an array of bumps extending rearwardly from a front end of said body section and projecting outwardly from said film-remote surface of said body section.

18. A backer plate as set forth in claim 17 wherein said member includes a layer of insulative material adjacent a front end of said body section and covering said bumps for isolation of said conductive backer plate from adjacent portions of contacts of said receptacle connector.

19. An assembly of a backer plate and an end portion of a flexible film circuit strip, wherein said backer plate comprises:
   a member having a body section with a film-non-adjacent surface and with a film-adjacent surface, said body section extending forwardly to a leading edge; and
   said member including side walls extending vertically from said film-adjacent surface along side edges thereof to define a film-receiving nest; and
   an end portion of said strip is received into said film-receiving nest and adhered to said film-adjacent surface to define an assembly insertable into a receiving cavity of a receptacle connector.

20. An assembly as set forth in claim 19 wherein said member is adhered to said strip end by double-sided adhesive tape.

21. An assembly as set forth in claim 20 wherein said side walls include flanges extending laterally outwardly therefrom complementary to guide slots of said receptacle connector adjacent said receiving cavity thereof.

22. An assembly as set forth in claim 21 wherein said flanges are offset vertically from a central plane of said body section adhered to said strip end portion when said guide slots of said receptacle connector are offset vertically from a central plane of said receiving cavity.

23. An assembly of a backer plate and an end portion of a flexible film circuit strip, for mating with a receptacle connector of the type defining a strip receiving cavity having guide slots along respective ends of the cavity offset vertically from a central plane of said cavity, wherein said backer plate comprises:
   a member having a body section with a film-non-adjacent surface and with a film-adjacent surface adhered to said strip along an end portion thereof to define an assembly;
   said body section extending forwardly to a leading edge adjacent a leading edge adjacent a leading end of said strip, said body section including side walls outwardly of respective side edges of said strip;
   said side walls each having a flange extending laterally outwardly therefrom adapted to be received into respective ones of said guide slots; and
   said flanges being offset vertically from a central plane of said body section adhered to said strip end portion,
      whereby said assembly is insertable into said receiving cavity in only one orientation when said flanges are aligned with and received into said guide receiving cavity when inverted from said one orientation.

24. An assembly as set forth in claim 23 wherein at least one side wall includes an upstanding boss spaced rearwardly from said leading edge to abut a forwardly facing surface of the receptacle connector adjacent an associated said end of said receiving cavity thereof to define a fully inserted condition.

25. An assembly as set forth in claim 23 wherein said member proximate said leading edge includes at least one retention section cooperable with a retention section associated with the receptacle connector to retain said strip in said receiving cavity upon full insertion.

26. An assembly as set forth in claim 25 wherein said retention section is a detent, cooperable with an embossment of said receptacle connector.

27. An assembly as set forth in claim 26 wherein said side walls define respective said detents.

28. An assembly as set forth in claim 25 wherein each said retention section is an embossment, cooperable with a detent associated with said receptacle connector.

29. An assembly as set forth in claim 28 wherein two said embossments are elongate and transverse and protrude from said film-non-adjacent surface of said body section spaced rearwardly from said leading edge thereof.

30. An arrangement of a receptacle connector mounted on a circuit board and including a strip receiving cavity, and an assembly of a backer plate and an end portion of a flexible film circuit strip for mating with the receptacle connector, comprising:
   said strip receiving cavity having guide slots at each end of the cavity;

said backer plate comprising:
a body section with a film-non-adjacent surface and with a film-adjacent surface adhered to said strip along an end portion thereof to define an assembly, said body section extending forwardly to a leading edge adjacent a leading end of said strip, and said body section including side walls outwardly of respective side edges of said strip adapted to be received into respective ones of said guide slots of said receptacle connector during insertion of said assembly into said strip-receiving cavity,
at least one embossment protrudes from said film-non-adjacent surface of said body section spaced rearwardly from said leading edge thereof; and
said circuit board including a detent complementary to each said at least one embossment defined forwardly of said strip receiving cavity of said receptacle connector,
whereby upon full insertion of said assembly into said strip receiving cavity, said at least one embossment seats in said complementary detent for retention of said assembly in mated condition within said cavity.

31. An arrangement as set forth in claim 30 wherein a pair of said embossments are elongate and transverse along said film-non-adjacent surface.

32. An arrangement as set forth in claim 30 wherein said member is molded of insulative material.

33. An arrangement as set forth in claim 30 wherein said backer plate is conductive.

34. An arrangement as set forth in claim 33 wherein said conductive backer plate is stamped and formed of metal.

35. An arrangement as set forth in claim 33 wherein said conductive backer plate includes a ground post electrically connected to a ground circuit of said flexible film strip, and said detent of said circuit board is conductively plated and connected to a ground circuit of the circuit board.

36. An arrangement as set forth in claim 33 wherein said conductive backer plate includes a layer of insulative material adjacent a front end of said body section, adhered to said film-non-adjacent surface thereof for isolation of said conductive backer plate from adjacent portions of contacts of said receptacle connector.

37. An arrangement of a receptacle connector mounted on a circuit board and including a strip receiving cavity, and an assembly of a backer plate and an end portion of a flexible film circuit strip for mating with the receptacle connector, comprising:
said strip receiving cavity having guide slots at each end of the cavity;
said backer plate comprising:
a body section with a film-non-adjacent surface and with a film-adjacent surface adhered to said strip along an end portion thereof to define an assembly, said body section extending forwardly to a leading edge adjacent a leading end of said strip, and said body section including side walls outwardly of respective side edges of said strip adapted to be received into respective ones of said guide slots of said receptacle connector during insertion of said assembly into said strip-receiving cavity,
at least one embossment protrudes from said film-non-adjacent surface of said body section spaced rearwardly from said leading edge thereof; and
said circuit board including a detent complementary to each said at least one embossment defined forwardly of said strip receiving cavity of said receptacle connector,
whereby upon full insertion of said assembly into said strip receiving cavity, said at least one embossment seats in said complementary detent for retention of said assembly in mated condition within said cavity,
wherein said backer plate is conductive, and
further wherein said conductive backer plate includes an array of bumps extending rearwardly from a front end of said body section and projecting outwardly from said film-non-adjacent surface of said body section.

38. An arrangement as set forth in claim 37 wherein said conductive backer plate includes a layer of insulative material adjacent a front end of said body section and covering said bumps for isolation of said conductive backer plate from adjacent portions of contacts of said receptacle connector.

\* \* \* \* \*